United States Patent
Hashimoto

(10) Patent No.: US 6,313,657 B1
(45) Date of Patent: Nov. 6, 2001

(54) IC TESTING APPARATUS AND TESTING METHOD USING SAME

(75) Inventor: Yoshihiro Hashimoto, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/467,722

(22) Filed: Dec. 20, 1999

(30) Foreign Application Priority Data

Dec. 24, 1998 (JP) ................................................ 10-366360

(51) Int. Cl.[7] .................................................. G01R 31/02
(52) U.S. Cl. .......................................... 324/763; 324/158.1
(58) Field of Search .................................... 324/537, 763, 324/765, 158.1; 714/734, 724, 738, 736; 361/764

(56) References Cited

U.S. PATENT DOCUMENTS

| | | | |
|---|---|---|---|
| 4,523,312 | * 6/1985 | Takeuchi | 371/1 |
| 5,101,153 | * 3/1992 | Morong | 324/158 R |
| 5,200,696 | * 4/1993 | Menis et al. | 324/158.1 |
| 5,757,203 | * 5/1998 | Brown | 324/765 |
| 5,945,822 | * 8/1999 | Shiotsuka | 324/158.1 |

\* cited by examiner

*Primary Examiner*—Safet Metjahic
*Assistant Examiner*—E P LeRoux
(74) *Attorney, Agent, or Firm*—David N. Lathrop, Esq.; Gallagher & Lathrop

(57) ABSTRACT

In an IC testing apparatus, a sense line which is used for purpose of voltage measurement and a force line which is used for purpose of current supply are connected to a terminal of an IC under test through a first switch and a second switch, respectively, and a functional tester is connected to the terminal of the IC under test through a third switch. The first to the third switch are formed by semiconductor switches, and a fourth switch formed by a semiconductor switch having a reduced on resistance is connected across terminals of the first switch and the second switch which are located opposite from their terminals connected to the terminal of the IC under test. During an overload test in the DC test, the fourth switch is turned on to execute the test.

13 Claims, 9 Drawing Sheets

IC TESTING APPARATUS AND TESTING METHOD USING SAME

BACKGROUND OF THE INVENTION

The invention relates to an IC testing apparatus and a testing method using the apparatus which are used to execute a DC test in which a direct current or d. c. voltage is applied to a terminal on an IC under test to examine a voltage or current characteristic occurring at that terminal and a functional test to see whether or not the IC operates normally.

FIG. 1 is an illustration of a conventional IC testing apparatus in summary. IC testing apparatus 20 comprises a DC tester 30, a functional tester 40 and a controller 50 which controls both of them.

A DC test includes a current-applied voltage measuring test in which a known current is passed through a terminal P of an IC under test 10 to determine a voltage VX developed at the terminal P to see if the voltage VX lies within a predetermined voltage range, and a voltage-applied current measuring test to examine if a predetermined current passes through the terminal P of the IC under test when a given voltage is applied to the terminal.

The DC tester 30 shown in FIG. I indicates an arrangement for the current-applied voltage measuring test. Specifically, in this test, the tester 30 includes a current source 31 and voltage measuring means 32. The current source 31 supplies a current IS of a known magnitude to the terminal P of the IC under test 10 through a force line FOR. The voltage measuring means 32 then determines a voltage VX which is developed at the terminal P of the IC under test 10 through a sense line SEN.

FIGS. 2 and 3 graphically show maximum assurance characteristic curves CL1 and CL2 and minimum assurance characteristic curves CL and CL4 based on results of measurement of current-voltage responses of P-channel FET 61 and N-channel FET 62 contained in output means 60 of the IC under test 10. In the current-applied voltage measuring test, a predetermined current IOH or IOL is passed through the terminal P to measure a resulting voltage VDS developed at the terminal P in order to determine if the resulting voltage-current response is contained in a range defined between the maximum and the minimum assurance characteristic curve, thus determining if the IC under test 10 is acceptable or faulty.

A first switch S1 and a second switch S2 are connected in series with the sense line SEN and the force line FOR, respectively. The first switch S1 and the second switch S2 are controlled by the controller 50 to be turned on for the direct current test and turned off for the functional test. In FIG. 1, a resistor R1 shown within a block indicated by S1 represents an on resistance of the switch S1 when it is turned on. Similarly, a resistor R2 shown within a block indicated by S2 represents an on resistance of the switch S2.

The functional tester 40 comprises a driver DR which applies a test pattern signal to the IC under test 10, a voltage comparator CP which determines whether or not a response signal from the IC under test 10 has a logic level of a voltage which satisfies a voltage requirement, and a programmable load PL which is used to examine ira given current IH or IL passes through the terminal P of the IC under test 10 during the functional test, with a common junction between the driver DR, the voltage comparator CP and the programmable load PL being connected to the terminal P of the IC under test 10 through a third switch S3. While not shown, it should be understood that the functional tester 40 also includes a function of generating a test pattern to be applied to the driver DR, a function of confirming that a proper logic level is delivered from the output of the voltage comparator CP at a preset timing or like functions, in a similar manner as in known IC testing apparatus. During the functional test, in order to determine if a voltage delivered from the terminal P of the IC under test 10 has a proper logic level, it is necessary that the driver DR exhibits a sufficiently high output impedance so as to be substantially isolated from the voltage comparator CP while a reference voltage VOH of a high logic level (H) be applied to the inverting input terminal of a voltage comparator CP1 and a reference voltage VOL of a low logic level (L) be applied to the non-inverting input terminal of a voltage comparator CP2. An output voltage from the terminal P of the IC under test 10 is compared against the reference voltages VOH and VOL by the voltage comparators CP1 and CP2, respectively. If the output voltage of the IC under test 10 assumes a proper high logic level, the voltage comparator CP1 delivers a high level output. If the output voltage of the IC under test 10 assumes a proper low logic level, the voltage comparator CP2 delivers a high level output. The controller 50 arranges for a sufficiently high output impedance of the driver DR and sets up the reference voltages VOH and VOL. During the functional test, the controller 50 also turns the third switch S3 on and turns the first switch S1 and the second switch S2 off.

FIG. 4 shows an arrangement of the DC tester 30 for the voltage-applied current measuring test. In this instance, the current source 31 is formed by an operational amplifier OP having its non-inverting input terminal connected to a voltage source 33 to receive a voltage EV therefrom. The operational amplifier OP also includes an output terminal which is connected through a force line FOR to a terminal P of an IC under test 10. A current detecting resistor Ri and a second switch S2 are connected in series in the force line FOR to apply a voltage to the terminal P of the IC under test 10. A voltage at the terminal P is fed back to the inverting input terminal of the operational amplifier OP through a sense line SEN and a first switch S1. The feedback is effective to maintain a voltage EV' which is applied to the terminal P of the IC under test 10 to be equal to the voltage EV of the voltage source 33. The arrangement allows any voltage of a known value to be applied to the terminal P of the IC under test 10 by choosing an arbitrary value for the voltage EV of the voltage source 33. Under the condition that a known voltage is applied, a voltage developed across the current detecting resistor Ri is measured by voltage measuring means 34, thus determining a current IOL or IOH which is either supplied to the IC under test 10 through the force line FOR or discharged from the IC under test 10 through the force line FOR. In this manner, the combination of the current detecting resistor Ri and the voltage measuring means 34 defines current measuring means IM.

The first switch S1 and the second switch S2 are turned on, during the voltage-applied current measuring test, but are turned off during the functional test to isolate the direct current tester 30 from the terminal P of the IC under test 10. During the DC test, the third switch S3 is controlled to be turned off, thus isolating the functional tester 40 from the terminal P of the IC under test 10, in the similar manner as shown in the arrangement of FIG. 1. Such controls are exercised by the controller 50.

As mentioned, the third switch S3 is provided to isolate the functional tester 40 during the DC test, while the first switch S1 and the second switch S2 are provided to isolate the DC tester 30 during the functional test. In the conventional practice, these switches S1 to S3 are served by reed relays. Reed relays are used for the reason that when used as the first to the third switch S1, S2 and S3, they exhibit a low on resistance, as represented by R1, R2 and R3, and allow for a relatively high current capacity on the order of 0.3 to 0.5 A, permitting a single reed relay to feed an amount of current which may be passed to the IC under test 10.

Specifically, the DC test includes a mode in which a direct current response of an IC under test is examined with a current flow in a normal range which may be on the order of 4 to 50 mA, and an overload test which examines whether or not a given current flow occurs in the event of a short-circuit condition. The overload current which may occur during the overload test is on the order of 50 mA to 200 mA at most, which can be satisfactorily served by a single reed relay.

However, because the reed relay comprises a mechanical contact structure, it suffers from a limited useful life, presenting problems in respect of reliability and durability.

To cope with these problems, it may be contemplated to use semiconductor switches for the first to the third switch S1, S2 and S3, as shown in FIG. 5. To be used as such a semiconductor switch, a semiconductor switching element of a type which can be turned on or off in response to light emission from a light emitting element would be generally useable. The reliability and the durability could be improved by the use of such a semiconductor switch, which however causes difficulties as mentioned below.

Specifically, semiconductor switches S1, S2 and S3 would exhibit relatively large on resistances R1, R2 and R3 and also relatively large off capacitances, which are notable drawbacks. The term an off capacitance is understood as a capacitance between contacts of a mechanical switch when it is off. Considering the DC test, the presence of a relatively large on resistance causes an inconvenience that a high current flow is precluded.

Turning to the functional test, the on resistance R3 of the third switch S3 will be connected in series with a signal transmission line LIN on the output side of the driver DR, and there will be created a current flow through the signal transmission line LIN which has the DC tester 30 connected as a load, the flow passing to a point of a common potential through a parallel connection of off capacitances C1 and C2 of the first switch S1 and the second switch S2, as shown in FIG. 6. If the DC tester 30 exhibits a low impedance, an increase in the capacitance of the off capacitors C1 and C2 causes an increased current flow to the DC tester 30, which in turn causes a significant degradation in the waveform quality of a test pattern signal that is transmitted on the signal transmission line LIN.

To conduct an overload test, it is demanded that the second switch S2 has a high current capacity. It is then desirable to use a semiconductor switch having a reduced on resistance for the second switch S2. A semiconductor switch having a reduced on resistance R2 would be manufactured by increasing the cross-sectional area of a portion of the semiconductor switch through which the current passes. This increases the off capacitance C2 disadvantageously. Conversely, if a semiconductor switch with a reduced off capacitance C2 is manufactured, the resulting on resistance would increase, thus presenting conflicting requirements. While it may be contemplated to construct a semiconductor switch with a reduced on resistance by a parallel connection of semiconductor switches each having a reduced off capacitance, an outcome of this is the fact that the parallel connection of a plurality of off capacitances results in an even greater off capacitance. A recent trend is toward an even higher operational speed of the functional test, and a demand then is a minimized off capacitance, which may be equal to or less than 1 pF, for the switches S1 and S2. The manufacture of a semiconductor switch with an off capacitance equal to or less than 1 pF may not be impossible, but results in a semiconductor switch having an increased on resistance, which disadvantageously involves an insufficient current capacity to be used as the second switch S2 which is required to pass an increased current flow.

For these reasons, where semiconductor switches are used as the switches S1 and S2, there results a disadvantage that an overload test can not be conducted.

It is an object of the invention to provide an IC testing apparatus connected to an output of a DC tester and incorporating semiconductor switches as a first switch S1 and a second switch S2 which may connect the DC tester to a terminal of an IC under test or to interrupt such connection while enabling an overload test during a DC test.

SUMMARY OF THE INVENTION

The present invention relates to an IC testing apparatus including a DC tester having voltage measuring means and a current source for executing a DC test of an IC under test by connecting the voltage measuring means and the current source to a terminal of an IC under test through a first switch and a second switch respectively. In accordance with the invention, the first and the second switch both comprise semiconductor switches, and a third switch the second switch across their terminals located toward the direct current tester. A functional tester which executes a functional test of an IC under test is connected to the terminal of the IC under test through a fourth switch, which may comprise a semiconductor switch as required.

When an overload test is conducted, the fourth switch is controlled to be turned on to thereby connect the functional tester to a terminal of an IC under test, and means is provided by a voltage comparator in the functional tester to determine if a voltage developed at the terminal of the IC under test is equal to or greater than a given value.

Both the first switch and the second switch are semiconductor switches, each having a reduced off capacitance, while the third switch comprises a semiconductor switch having an on resistance which is less than the on resistance of the first and the second switch.

With the IC testing apparatus according to the invention, during the DC test, in particular, during an overload test, the third switch is turned on to connect a sense line which is associated with voltage measuring means to a current source through the third switch, and to connect the first and the second switch in parallel to allow an overcurrent to be passed from the current source to the terminal of the IC under test. Accordingly, if the first and the second switch have reduced off capacitances while exhibiting increased on resistances, a parallel connection of the first and the second switch reduces the on resistance of the parallel connection of these switches. For example, when the on resistances of the first and the second switch are substantially equal to each other, the on resistance of their parallel connection will be reduced to one-half the on resistance of the single switch, allowing an overload current of an increased magnitude to be passed satisfactorily to the terminal.

Since the semiconductor switches having reduced off capacitances which are on the order of 1 pF or less are used for the first and the second switch, a current flow passing to a load comprising the DC tester during the functional test is negligible, whereby a degradation in the waveform of a test pattern signal which is supplied to the IC under test can be minimized.

During the overload test, voltage measuring means within the DC tester is disabled, but an arrangement can be made as mentioned previously so that a voltage comparator in the functional tester may be used to determine if a voltage developed at the terminal of the IC under test is equal to or greater than a given value, thus enabling the overload test to be executed without incurring an increase in the number of components.

When semiconductor switches having substantially equal on resistances are used for the first and the second switch, and a semiconductor switch having an on resistance which is reduced with respect to the on resistances of the first and the second switch is used for the third switch, as the third switch is turned on during the overload test, there cannot be developed any significant difference between the current flows through the first and the second switch. In this manner, a substantially even current flow is assured through the first and the second switch, preventing the occurrence of a biased current flow in one of these semiconductor switches. Obviously, the less the on resistance of the third switch, the better. However, it is desirable that the on resistance of the third switch be by an order of magnitude less than on resistances of the first and the second switch.

BRIEF DESCRIPTION OF THE DRAWINGS

FIG. 6 is an equivalent circuit diagram of a circuit portion including switches S1, S2 and S3 shown in the block diagram of FIG. 5 where the switches S1 and S2 are off while the switch S3 is on;

DESCRIPTION OF PREFERRED EMBODIMENTS

Figure 1:
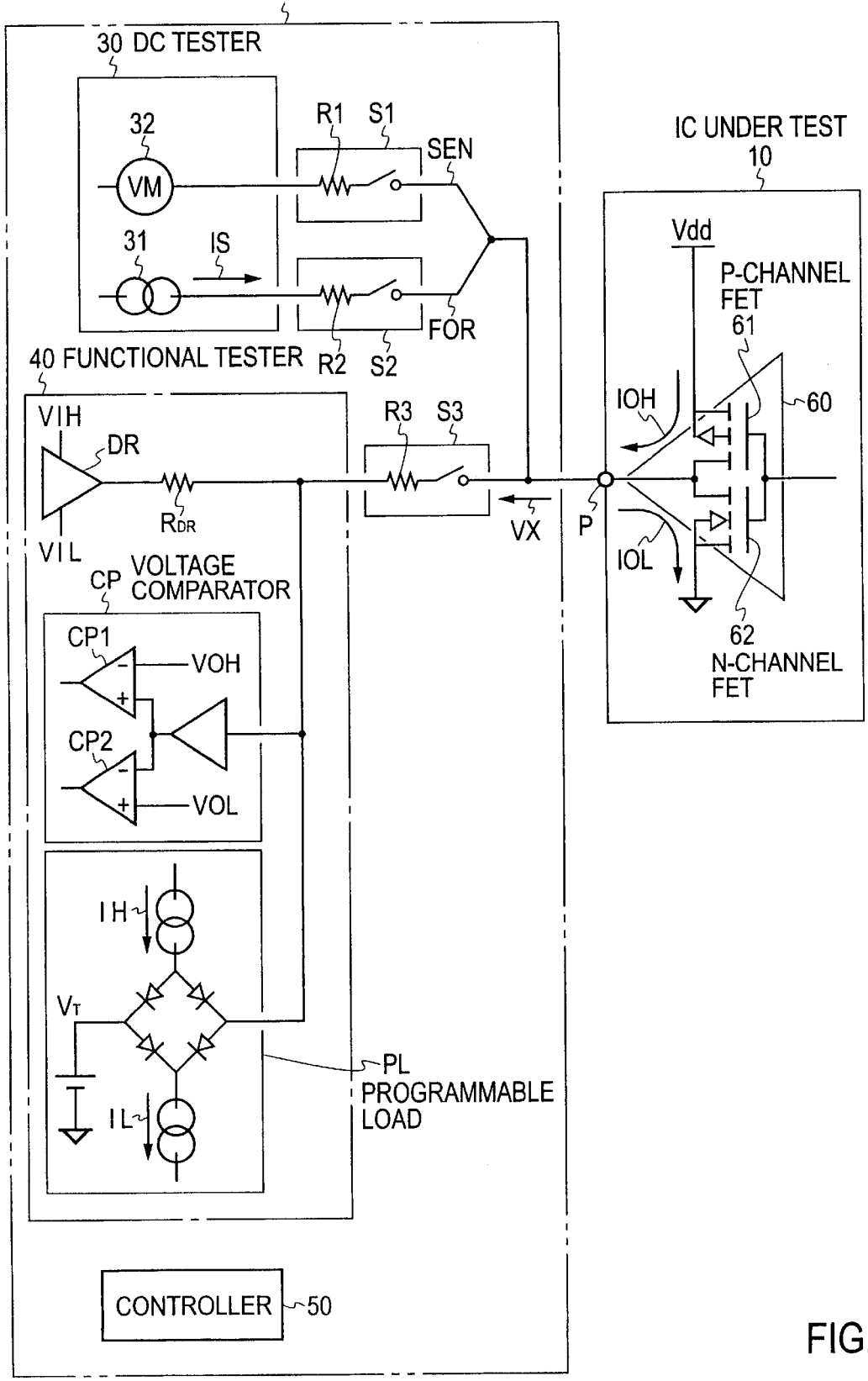
FIG. 1 is a block diagram of a prior art for conducting current-applied voltage measurement.
Figure 2:
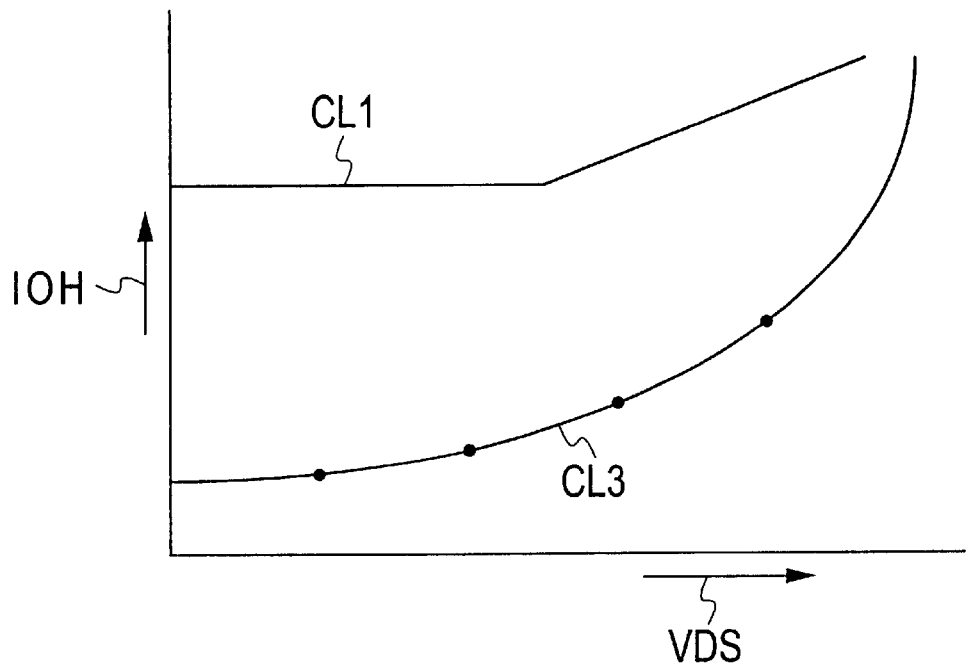
FIG. 2 graphically shows a current-voltage response of a P-channel FET in an output stage which is incorporated in an IC being tested.
Figure 3:
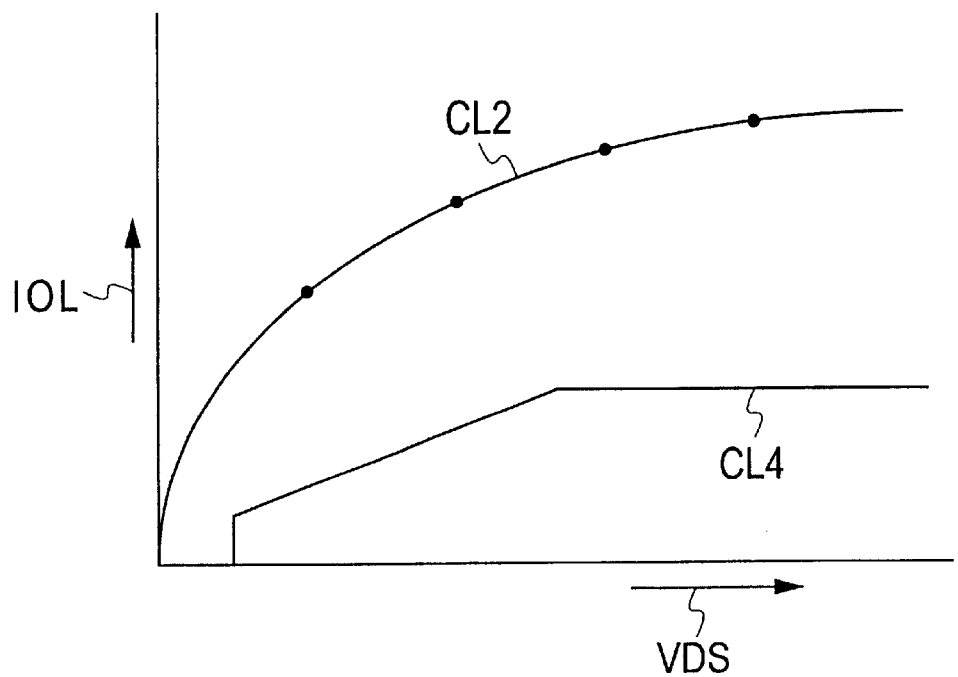
FIG. 3 graphically shows a current-voltage response of an N-channel FET in an output stage incorporated in an IC being tested.
Figure 5:
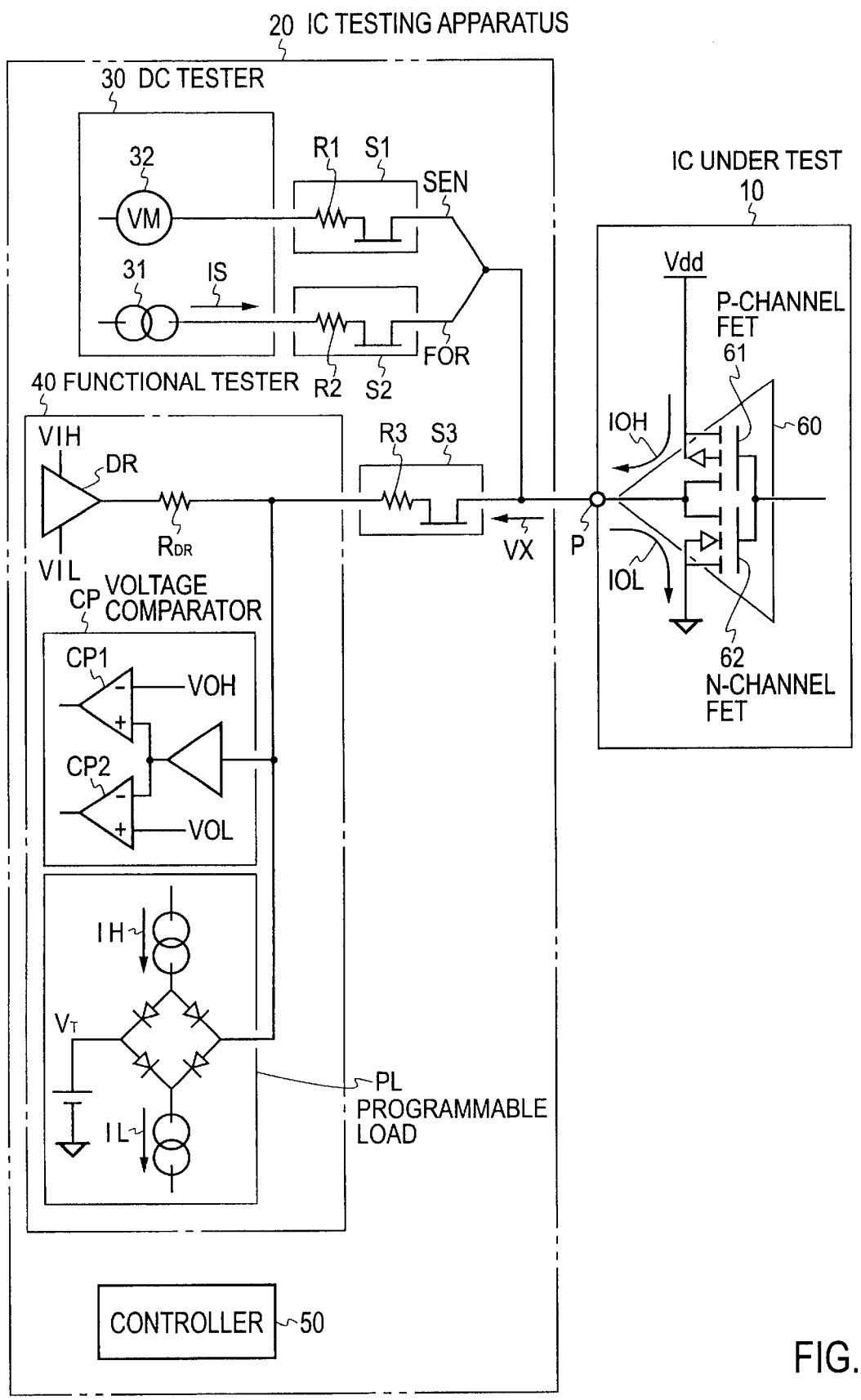
FIG. 5 is a block diagram which could be contemplated in view of the prior art.
Figure 6:
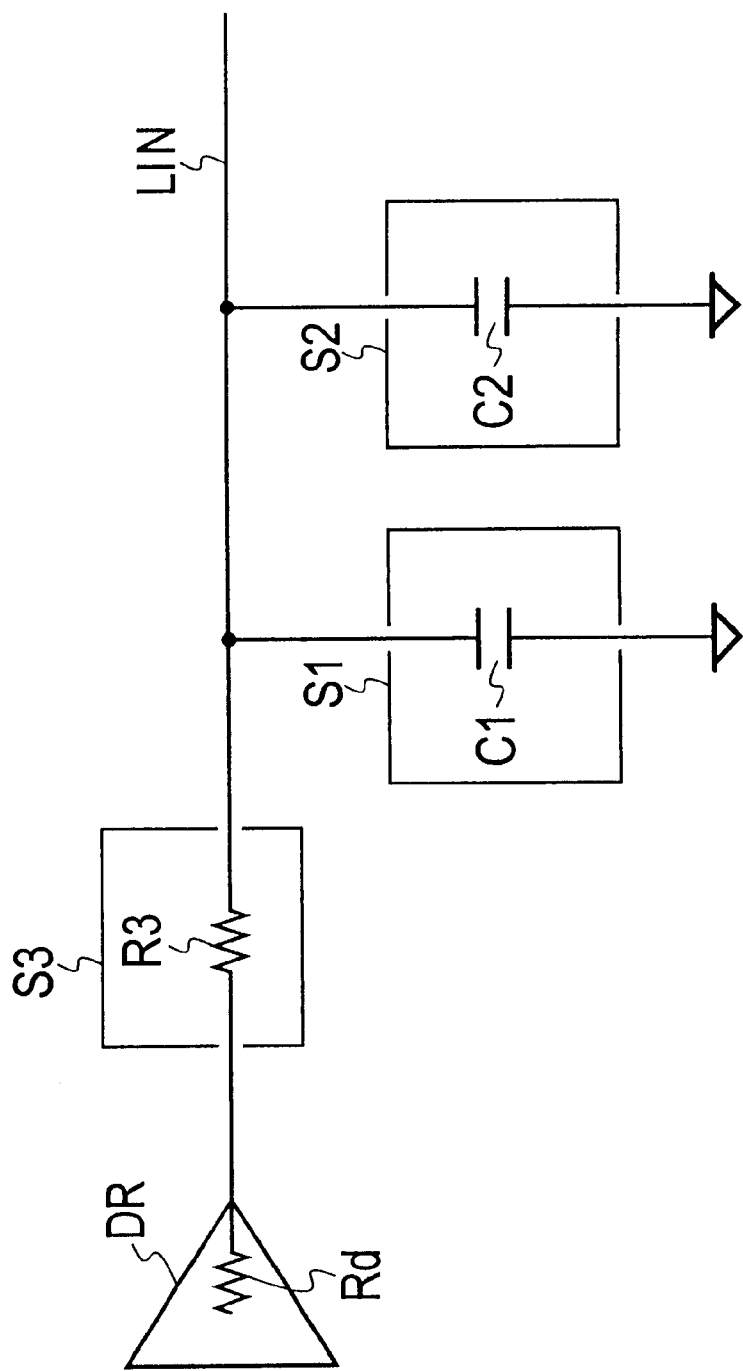
Figure 7:
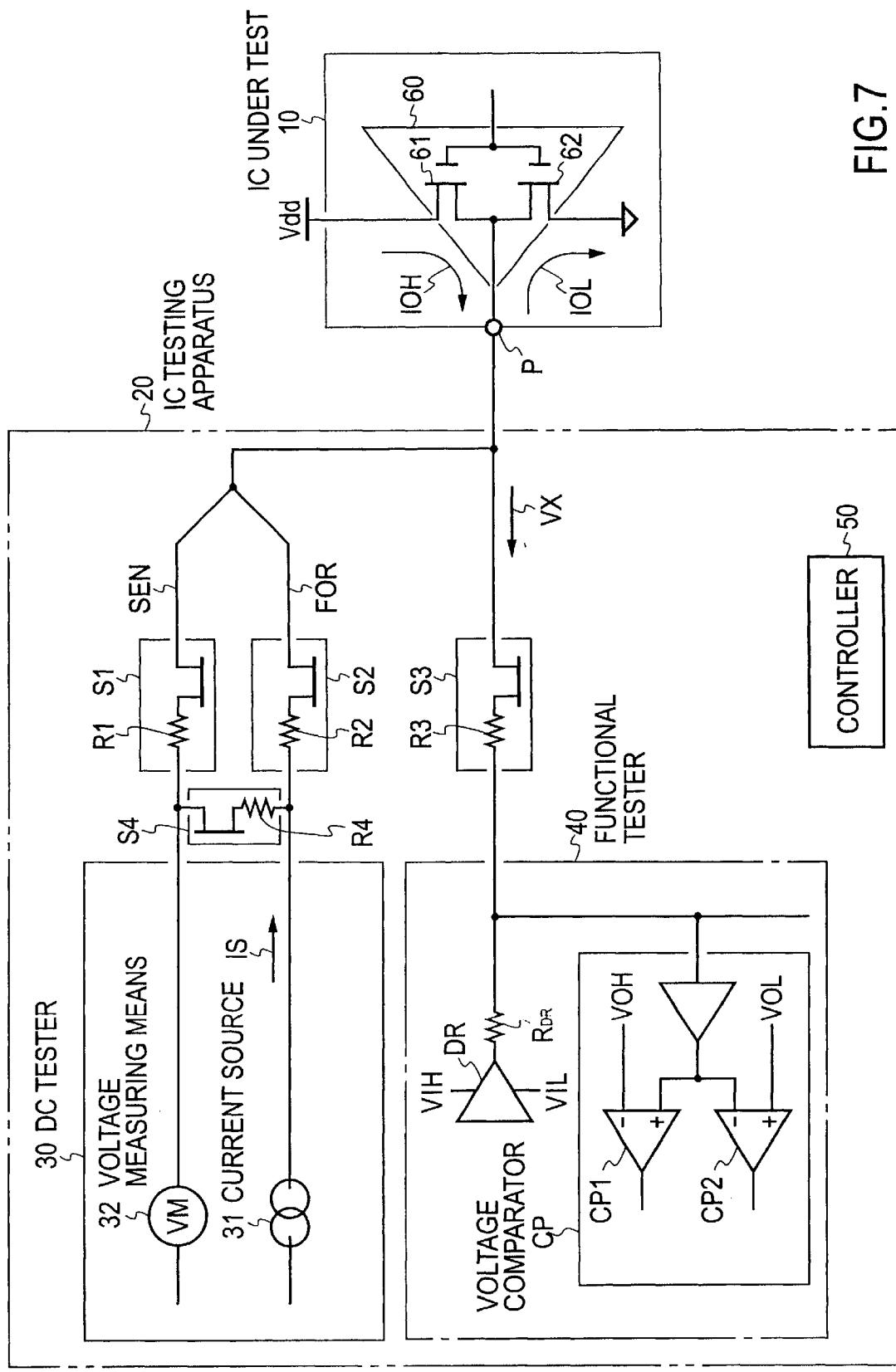
FIG. 7 is a block diagram of one embodiment of the invention.

FIG. 7 shows one embodiment of an IC testing apparatus according to the invention, and corresponding parts to those shown in FIG. 5 are designated by like numerals and characters as used before. The embodiment is shown for the application of the present invention for an arrangement of a DC tester which performs a current-applied voltage measuring test in the similar manner as shown in FIG. 1. It is features of the invention that semiconductor switches are used for all of a first switch S1, a second switch S2 and a third switch S3 and that a fourth switch S4 is connected across the terminals of the first switch S1 and the second switch S2 which are located opposite from the remaining terminals connected to a terminal P of an IC under test 10 or across their terminals located toward the DC tester 30.

Semiconductor switches used for the first switch S1 to the fourth switch S4 are preferably of a type as mentioned above in connection with FIG. 5 which are turned on and off in response to a light emission from a light emitting element, for example. The first switch S1 and the second switch S2 employ semiconductor switches having a reduced off capacitance if their on resistances R1 and R2 are relatively high. For example, the on resistance may be on the order of 20 Ω and the off capacitance is equal to or less than 1 pF. The fourth switch S4 employs a semiconductor switch having an on resistance R4 which is less than the on resistance of each of the first switch S1 and the second switch S2 even though the off capacitance may be greater. There is no particular limitation applied to the third switch S3, but preferably employs a semiconductor switch having a reduced change in the on resistance R3 in order to maintain a constant transmission line impedance.

When conducting a DC test in a normal current region on the order of 4 to 50 mA, a controller 50 controls the switches so that the first switch S2 and the second switch S2 are turned on while the third switch S3 and the fourth switch S4 are turned off. Accordingly, a current IS is supplied from a current source 31 to an IC under test 10 through a force line FOR, and a voltage developed at the terminal P while the current IS is being passed can be accurately measured by voltage measuring mean 32 through a sense line SEN. Thus, this test remains the same as the current-applied voltage measuring test mentioned previously in connection with FIG. 1.

On the other hand, when conducting a current-applied voltage measuring test under an overload condition, the controller 50 controls the fourth switch S4 to be turned on also. Under this condition, the first switch S1 and the sense line SEN associated with the voltage measuring means are connected to the current source 31 through the fourth switch S4, and the first switch S1 and the second switch S2 are connected in parallel relationship to each other through the fourth switch S4. Accordingly, if the first switch S1 and the second switch S2 had substantially equal on resistances, the parallel connection results in reducing the equivalent on resistance presented by the first switch S1 and the second switch S2 to be reduced to nearly one-half, allowing an increased current flow from the current source 31 to the terminal P. To accomplish such an effect, it is preferred that the on resistance of the fourth switch S4 be by an order of magnitude or more less than the on resistance of the first switch S1 and the on resistance of the second switch S2. During the functional test, both the first switch S1 and the second switch S2 are turned off, and because the off capacitances of the first switch S1 and the second switch S2 are reduced as may be exemplified by their values equal to or less than 1 pF, they present a sufficiently high impedance to prevent a test pattern signal from passing into the DC tester 30, thus avoiding the likelihood of causing a degradation in the waveform of the test pattern signal.

As a result of a current flow through first switch S1 and the fourth switch S4 during the overload test, there is a likelihood that voltage drops developed across the first switch S1 and the fourth switch S4 may be incorporated into the measurement of the voltage at the terminal P by the voltage measuring means 32. However, during the overload test, it is possible to determine whether or not the voltage developed at the terminal P be a normal value using a voltage comparator CP provided in a functional tester 40. Thus, when a normal voltage is applied to set up a reference voltage VOH or VOL in the voltage comparator CP, it is then possible to determine whether or not the voltage developed at the terminal P lies in a given range. In this instance, the third switch S3 is turned on, and the controller 50 controls a driver DR so that it presents a sufficiently high output impedance or so that the driver DR is substantially isolated in the similar manner as when determining whether an input signal pattern from the IC under test 10 assumes a high level or a low level.

For example, when assuming an internal impedance of the IC under test 10 to be 5 Ω and that an overload current of 200 mA is passed to the terminal P of the IC under test 10, a voltage VX=5 Ω×200 mA=1V should occur at the terminal P.

Accordingly, if a current of 200 mA is applied to the terminal of the IC under test 10 from the current source 31 and a voltage equal to or greater than 1V occurs at the terminal P, this means that an internal impedance equal to or greater than 5 Ω exists, allowing a determination of an acceptable product. To determine whether or not a voltage equal to 1V has occurred at the terminal P using the voltage comparator CP in the functional tester 40, a reference voltage VOH of 1V may be set up on a voltage comparator CP1, for example, and a voltage VX to be measured can be determined whether it is equal to or greater than or less than 1V, by seeing if an output voltage from the voltage comparator CP1, representing a result of comparison, assumes an H logic level or L logic level. Alternatively, a reference voltage VOL of 1V may be set up on a voltage comparator CP2 to allow a determination that the product is acceptable when an output from the voltage comparator CP2 assumes an L logic level. The controller 50 deals with setting up the reference voltages VOH and VOL and the delivery of a result of comparison.

Figure 8:
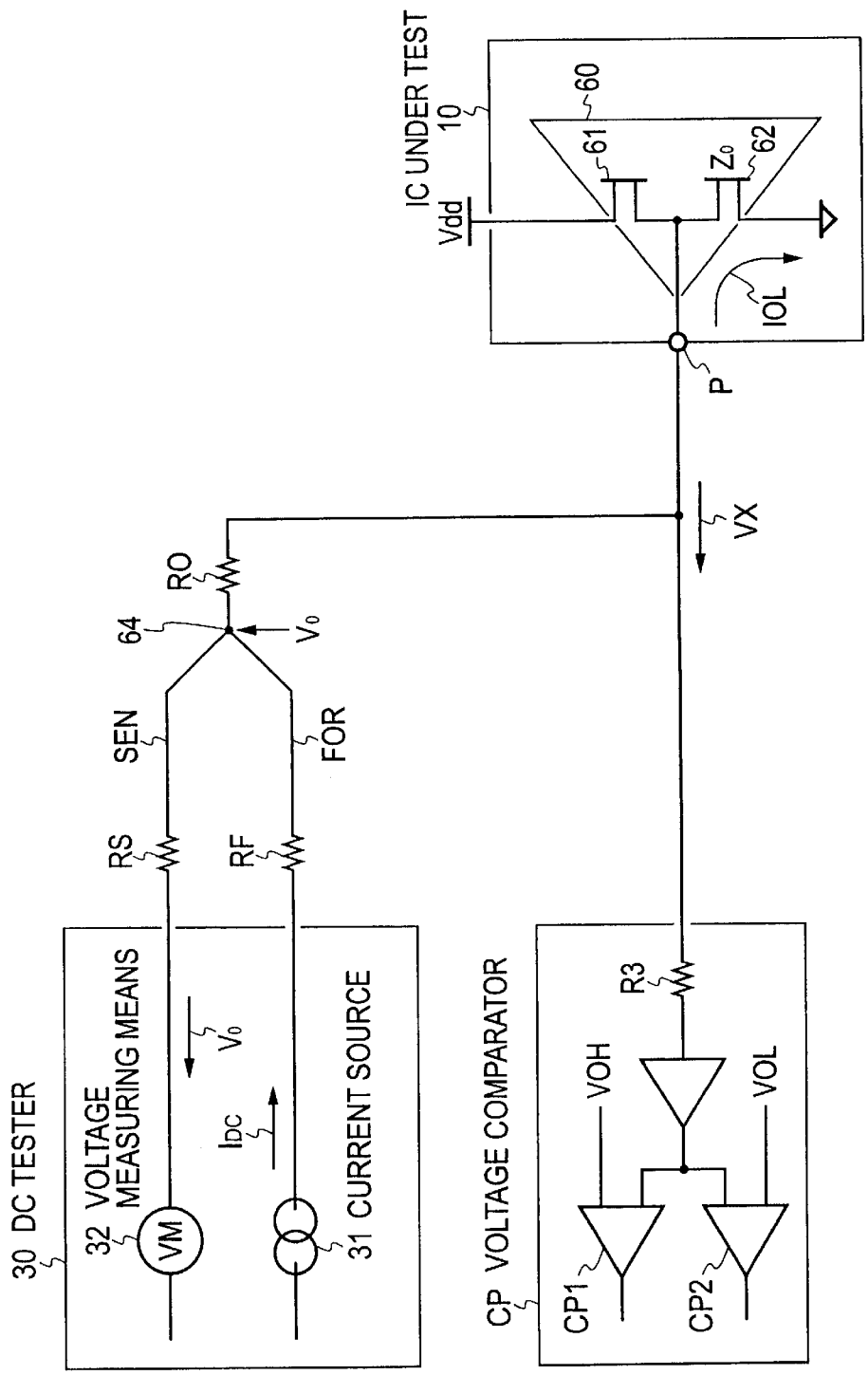
FIG. 8 is an equivalent circuit diagram for describing the operation of the embodiment shown in FIG. 7.

When it is desired to determine the voltage value VX which is developed at the terminal P during the overload test, a circuit portion including the switches S1, S2 and S4 shown in FIG. 7 may be represented by an equivalent circuit as shown in FIG. 8 which comprises an equivalent resistor having a resistance RS connected in the sense line SEN, an equivalent resistor of a resistance RF connected in the force line FOR and an equivalent resistor of a resistance RO connected between a junction between the both equivalent resistors of the sense line SEN and the force line FOR and the terminal P. In other words, the respective on resistances of the first switch S1, the second switch S2 and the fourth switch S4 may be previously measured and the values of the equivalent resistances RS, RF and RO may be determined from these measurements. In this manner, a circuit portion comprising the on resistances of the first switch S1, the second switch S2 and the fourth switch S4 may be subject to a delta-star (Δ-Y) conversion including the equivalent resistances RS, RF and RO, and the value of the voltage VX developed at the terminal P can be calculated from the measurement obtained with the voltage measuring means 32 in a manner described below.

It will be seen that the equivalent resistances RS, RF and RO shown in FIG. 8 can be determined from the on resistances R1 and R2 of the first switch S1 and the second switch S2 and the on resistance R4 of the fourth switch S4 as follows:

$$RS=(R2\times R4)/(R1+R2+R4)$$

$$RF=(R4\times R1)/(R1+R2+R4) \quad (1)$$

$$RO=(R1\times R2)/(R1+R2+R4)$$

For example, assuming that R1=20 Ω, R2=20 Ω and R4=1 Ω, it then follows that RS=0.49 Ω, RF=0.49 Ω and RO=9.76 Ω.

A voltage Vo at a junction 64 between the equivalent resistor having an equivalent resistance RS and the equivalent resistor having an equivalent resistance RF is measured by the voltage measuring means 32, and using the current $I_{DC}$ supplied from the current source 31, it can be expressed as follows:

$$Vo=VX+(RO\times I_{DC})$$

Accordingly, VX to be obtained can be calculated as follows:

$$VX=Vo-(RO\times I_{DC})$$

For example, if the measured voltage Vo is equal to 2.952V, RO=9.76 Ω and $I_{DC}$=200 mA, we have $$VX=2.952V-(9.76\ \Omega\times 200\ mA)=1V$$

Accordingly, when the controller 50 is used to perform a subtraction of the previously determined value $RO\times I_{DC}$ from the voltage value Vo measured by the voltage measuring means 32, the voltage VX developed at the terminal P can be calculated. The result of calculation can be used to determine whether the overload test indicated an acceptable or faulty product.

Figure 4:
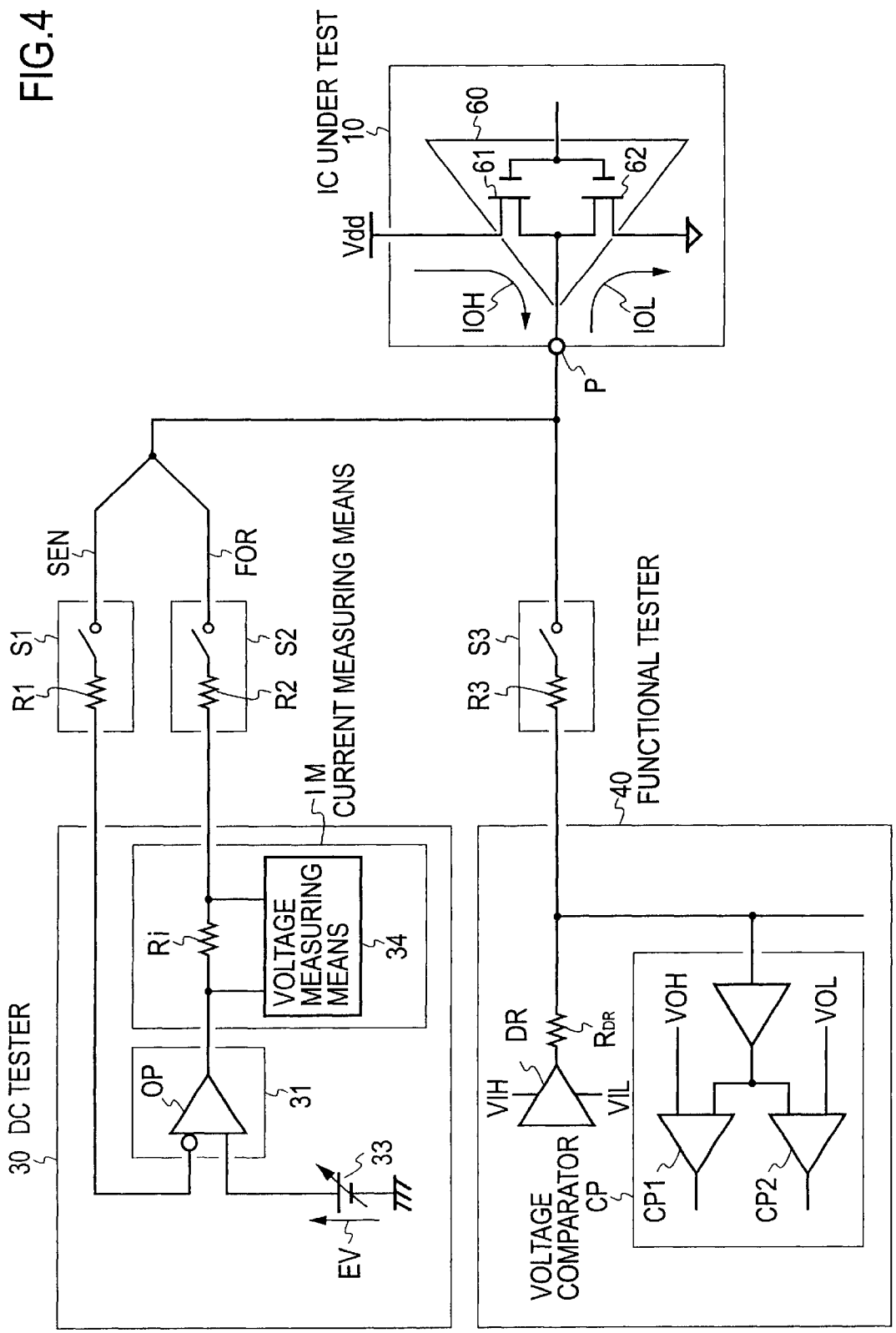
FIG. 4 is a block diagram of a prior art for conducting a voltage-applied current measurement.
Figure 9:
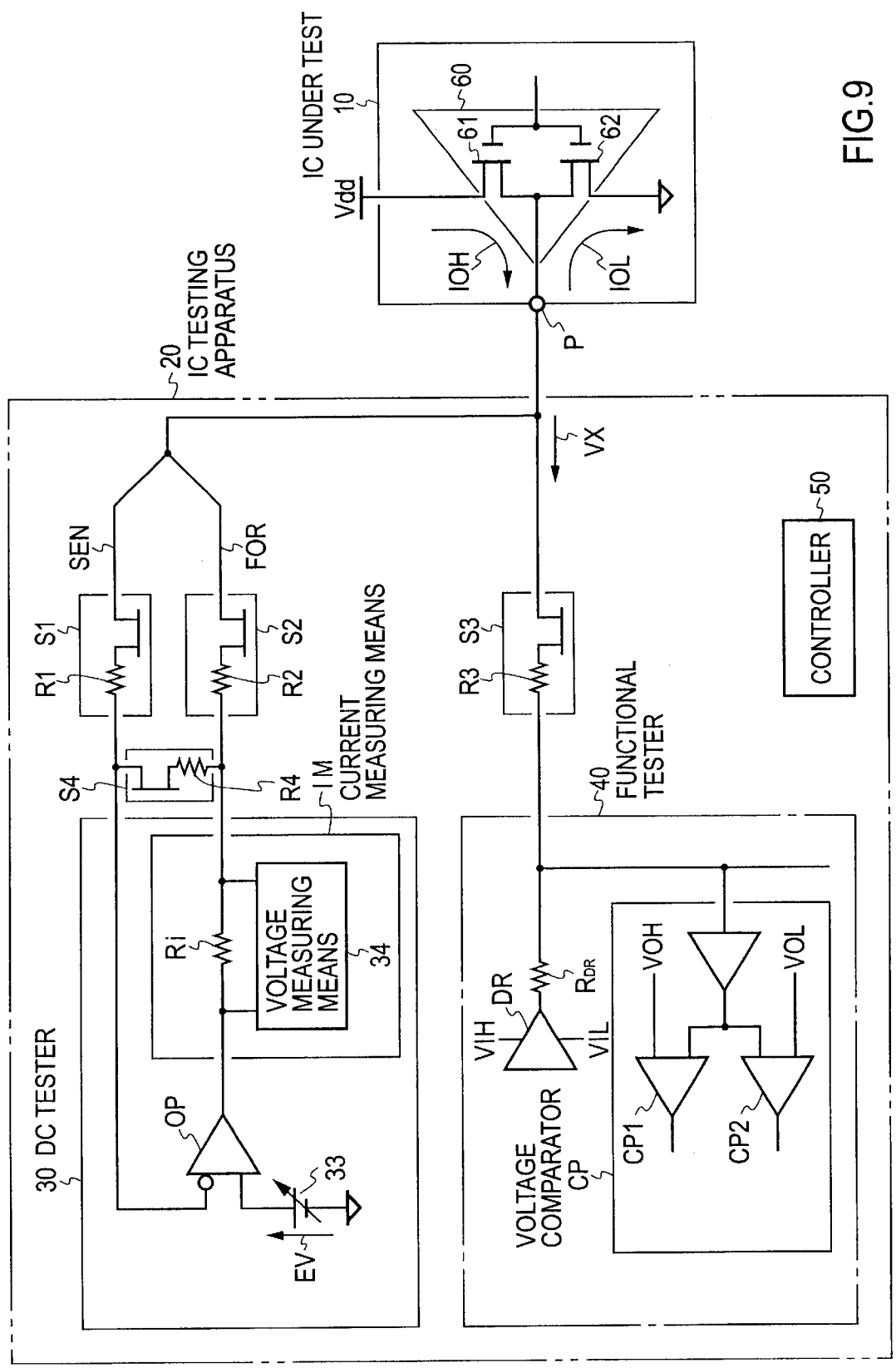
FIG. 9 is a block diagram of a modification of the embodiment of the invention.

FIG. 9 shows the application of the present invention to the DC tester 30 for an arrangement which performs a voltage-applied current measuring test which was previously described in connection with FIG. 4. Again, a fourth switch S4 formed by a semiconductor switch having a reduced on resistance is connected across the terminals of a first switch S1 and a second switch S2 which are opposite from those terminals connected to an IC under test 10. During the overload test, the fourth switch S4 is turned on to enhance the current capacity.

During the voltage-applied current measuring mode, a voltage-applied current measuring test in a normal current region on the order of 4 to 50 mA takes place by turning the fourth switch S4 off. Accordingly, it may be considered that there is no current flow through the on resistance R1 of the first switch S1. A voltage drop across the on resistance R2 of the second switch S2 is fed back through the sense line SEN to an operational amplifier OP, and accordingly, the voltage applied to the terminal P of the IC under test 10 can be maintained at the level substantially equal to the voltage EV of a voltage source 33. A current IOL flowing into or a current IOH flowing out of the IC under test 10 can be measured under such condition of applied voltage.

Figure 10:
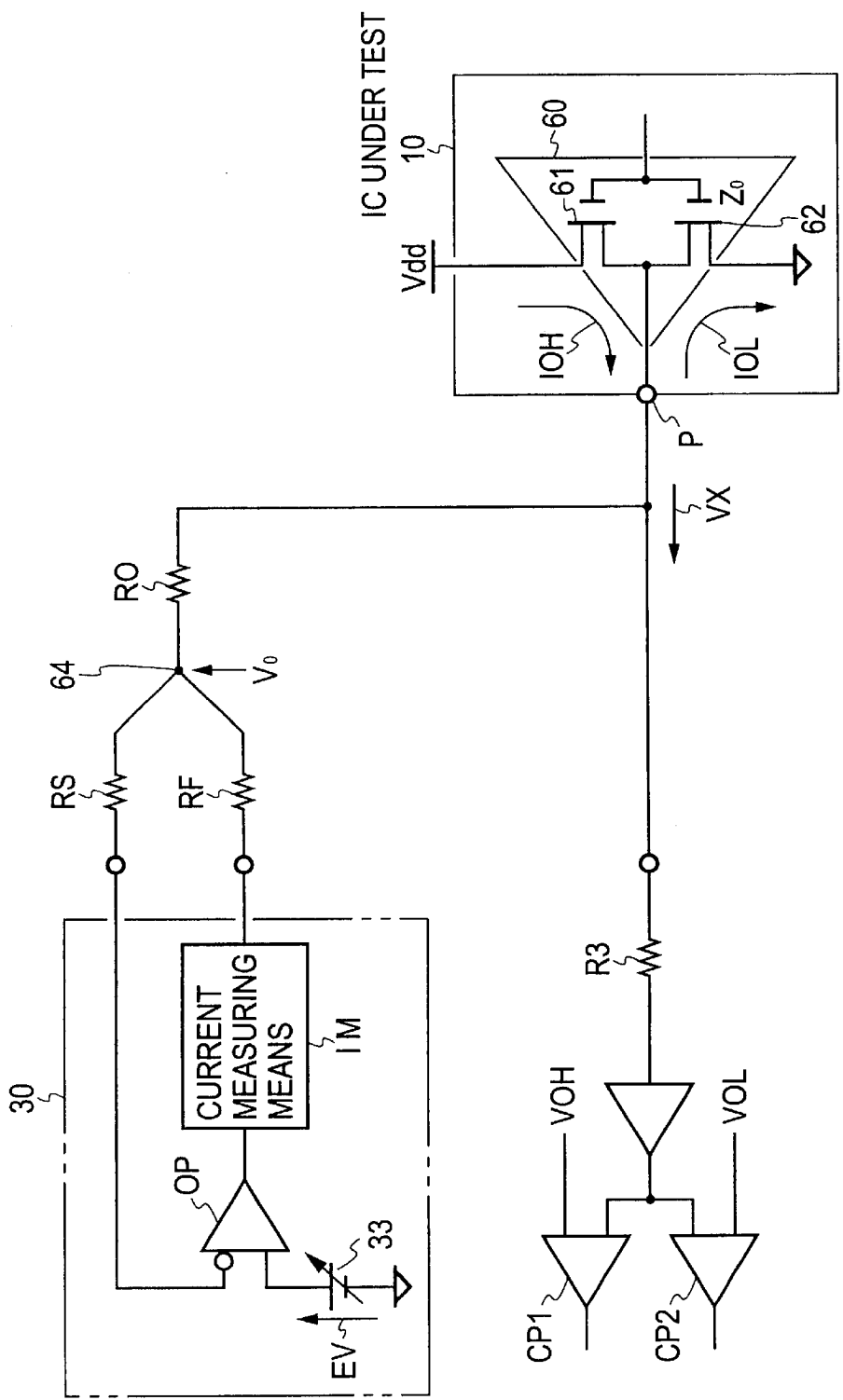
FIG. 10 is an equivalent circuit diagram for describing the operation of the embodiment shown in FIG. 9.

When conducting an overload test in the voltage-applied current measuring mode, the arrangement in the normal voltage-applied current measuring mode is modified by further turning the fourth switch S4 on. When the fourth switch S4 is turned on, the circuit portion including the switches S1, S2 and S4 can be considered by an equivalent circuit in the star connection of equivalent resistances RS, RF and RO as indicated in FIG. 10, in the similar manner as the equivalent circuit shown in FIG. 8, whereby the voltage-applied measuring test under the overload condition is executed by compensating for a voltage drop across the equivalent resistor having an equivalent resistance RO which is located nearer the terminal P of the IC under test 10.

Assuming that the first switch S1 has an on resistance R1 of 20 Ω, the second switch S2 has an on resistance R2 of 20 Ω and the fourth switch 54 has an on resistance R4 of 1 Ω, it then follows from the equation (1) given above that RS=0.49 Ω, RF=0.49 Ω and RO=9.76 Ω.

It may be assumed that the ratings of the IC under test 10 are such that a voltage VX (test voltage) applied to the terminal P is 1V, and the overload current IOL has a minimum value $IOL_{(MIN)}$ of 100 mA and a maximum value $IOL_{(MAX)}$ of 200 mA. It then follows that it order that VX=1V can be maintained when the minimum overload current of 100 mA and the maximum overload current of 200 mA are passed, in consideration of a voltage drop across the equivalent resistor having the equivalence resistance RO, a maximum value $Vo_{(MAX)}$ and a minimum value $Vo_{(MIN)}$ of a voltage Vo at the junction 64 between the three equivalent resistors are given as follows:

$$Vo_{(MAX)}=(RO \times IOL_{(MAX)})+(VX)=(9.76\ \Omega \times 200\ mA)+(1V)=2.952V$$

$$Vo_{(MIN)}=(RO \times IOL_{(MIN)})+(VX)=(9.76\ \Omega \times 100\ mA)+(1V)=1.976V$$

Thus, the voltage EV of the voltage source 33 is controlled by the controller 50 so that the voltage Vo at the junction 64 between the three equivalent resistors shown in FIG. 10 can assume 2.952V or 1.976V, and a current which passes through the current measuring means IM is measured while the respective voltage is applied to the terminal P of the IC under test 10. A determination that the IC under test 10 is acceptable is rendered if the current is equal to 200 mA or less for Vo=2.952V and the current is equal to 100 mA or greater for Vo=1.976V.

Thus it will be seen that the voltage-applied current measuring test under the overload condition can be conducted when the first switch S1 and the second switch S2 are replaced by semiconductor switches having relatively large on resistances if the fourth switch S4 having an on resistance which is by an order of magnitude or more less than the on resistance of the switch S1 or S2 is connected across the terminals of the first switch S1 and the second switch S2 which are located nearer the DC tester.

The third switch has been described as comprising a semiconductor switch in the above description, but where a semiconductor switch which lends itself to the use of a high rate test pattern signal is unavailable, the third switch S3 may be replaced by a reed relay or any other desirable switch.

As described, in accordance with the invention, the first switch S1 and the second switch S2 can be replaced by the semiconductor switches to provide an IC testing apparatus with a high durability and reliability. In addition, the fourth switch S4 having a reduced on resistance is connected across the terminals of the first switch S1 and the second switch S2 which are opposite from those terminals connected to the IC under test 10, whereby the reduced on resistance of the fourth switch S4 is effective to provide a substantial parallel connection of the first switch S1 and the second switch S2. Accordingly, if the first switch S1 and the second switch S2 have relatively large on resistances, the combination of these on resistances can be converted into a reduced equivalent resistance. This allows an overcurrent which is required to conduct an overload test can be passed through the first switch S1 and the second switch S2.

In addition, since the first switch S1 and the second switch S2 comprise switch elements having reduced off capacitances, there is obtained an advantage that if a high rate test pattern signal is passed on the transmission line during the functional test, a degradation in the waveform of the test pattern signal can be suppressed.

Accordingly, the invention allows an IC testing apparatus and a testing method using the apparatus which exhibit a high durability and reliability and which allow the execution of an overload test to be provided by a mere addition to the circuit arrangement, thus providing substantial practical advantages.

It should be understood that the present invention is not limited to the specific embodiments disclosed herein, but that a number of changes, modifications and substitutions are possible therein without departing from the spirit and the scope of the invention defined by the appended claims.

What is claimed is:

1. An IC testing apparatus including a DC tester which is provided with voltage measuring means and a current source, and a functional tester; comprising
    a first switch formed by a semiconductor switch for connecting the voltage measuring means to a terminal of an IC under test;
    a second switch formed by a semiconductor switch for connecting the current source to a terminal of an IC under test;
    and a third switch formed by a semiconductor switch and connected between terminals of the first switch and the second switch which are disposed toward the DC tester.

2. An IC testing apparatus according to claim 1 in which the third switch has an on resistance which is reduced as compared with on resistances of the first switch and the second switch.

3. An IC testing apparatus according to claim 2 in which the first switch has an on resistance which is substantially equal to the on resistance of the second switch and the third switch has an on resistance which is by an order of magnitude or more less than the respective on resistances of the first switch and the second switch.

4. An IC testing apparatus according to claim 1, further comprising
    a fourth switch for connecting the functional tester to a terminal of the IC under test;
    and means operative when an overload test is conducted in which an overcurrent is supplied from the current source to a terminal of the IC under test to turn the first switch, the second switch, the third switch and the fourth switch on and to determine whether or not a voltage developed at the terminal of the IC under test is equal to or greater than a given value using a voltage comparator contained in the functional tester.

5. An IC testing apparatus according to claim 4 in which the first switch has an on resistance which is substantially equal to the on resistance of the second switch and the third switch has an on resistance which is by an order of magnitude or more less than the respective own resistances of the first switch and the second switch.

6. An IC testing apparatus according to claim 4 in which the fourth switch comprises a semiconductor switch.

7. An IC testing apparatus according to claim 1, further comprising
    a fourth switch formed by a semiconductor switch for connecting the functional tester to a terminal of the IC under test.

8. An IC testing apparatus including a DC tester having a preset voltage generator, an operational amplifier receiving a voltage generated by the preset voltage generator and a feedback voltage and current measuring means for determining an output current from the operational amplifier, and a functional tester, comprising
    a first switch formed by a semiconductor switch for connecting the output of the operational amplifier to a terminal of an IC under test;
    a second switch formed by a semiconductor switch for connecting a terminal of the operational amplifier which receives the feedback voltage to a terminal of the IC under test;

a third switch formed by a semiconductor switch and connected between terminals of the first switch and the second switch which are located toward the direct current tester.

9. An IC testing apparatus according to claim 8 in which the third switch has an on resistance which is reduced as compared with respective on resistances of the first switch and the second switch.

10. An IC testing apparatus according to claim 9 in which the first switch has an on resistance which is substantially equal to the on resistance of the second switch and the third switch has an on resistance which is by an order of magnitude or more less than the respective on resistances of the first switch and the second switch.

11. A method of testing an IC under test using an apparatus including a DC tester having a current source and voltage measuring means and a functional tester having a driver and a voltage comparator, comprising the steps of turning a first switch formed by a semiconductor switch on to connect the current source to a terminal of the IC under test;

turning a second switch formed by a semiconductor switch on to connect the voltage measuring means to a terminal of the IC under test;

turning a third switch on to connect the voltage comparator to a terminal of the IC under test;

turning a fourth switch formed by a semiconductor switch on to connect between terminals of the first switch and the second switch which are disposed toward the DC tester;

passing an overcurrent from the current source to a terminal of the IC under test;

and comparing a voltage developed at the terminal of the IC under test against a normal voltage in the voltage comparator to determine whether the IC under test is acceptable or faulty.

12. A method of testing an IC under test using an apparatus including a DC tester having a current source and voltage measuring means and a functional tester, comprising the steps of turning a first switch formed by a semiconductor switch on to connect the current source to a terminal of the IC under test;

turning a second switch formed by a semiconductor switch on to connect the voltage measuring means to a terminal of the IC under test;

turning a third switch formed by a semiconductor switch on to connect between terminals of the first switch and the second switch which are disposed toward the DC tester;

passing an overcurrent $I_{DC}$ from the current source to a terminal of the IC under test;

measuring a voltage Vo applied to the voltage measuring means which results from a voltage VX developed at the terminal of the IC under test;

and determining the voltage VX developed at the terminal of the IC under test according to the equation $VX=Vo-(RO \times I_{DC})$ where RO represents an equivalent resistance of an equivalent resistor which would be connected to the terminal of the IC under test when a circuit portion formed by the first switch, the second switch and the third switch is represented as a star connection of three equivalent resistors.

13. A method of testing an IC under test using an apparatus including a DC tester having voltage generating means and current measuring means and a functional tester, comprising the steps of turning a first switch formed by a semiconductor switch on to connect the voltage generating means to a terminal of the IC under test through the current measuring means;

turning a second switch formed by a semiconductor switch on to connect the terminal of the IC under test to a feedback terminal of the voltage generating means;

turning a third switch formed by a semiconductor switch on to connect between terminals of the first switch and the second switch which are disposed toward the DC tester;

on the basis of an equivalent resistance RO of an equivalent resistor which would be connected to the terminal of the IC under test when a circuit portion including the first switch, the second switch and the fourth switch is represented in a star connection of three equivalent resistors, a given voltage VX to be applied to the IC under test, and a maximum permissible overload current $IOL_{MAX}$ and a minimum permissible overload current $IOL_{MIN}$ which would pass through the terminal when the given voltage VX is applied to the terminal of the IC under test, calculating $Vo_{(MAX)}=RO \times IOL_{MAX}+VX$ and $Vo_{(MIN)}=RO \times IOL_{MIN}+VX$;

setting up the calculated $Vo_{(MAX)}$ at the voltage generating means and applying the voltage to the terminal of the IC under test;

measuring a current passing through the terminal of the IC under test by the current measuring means while $Vo_{(MAX)}$ is set up;

examining if the measured current is equal to or less than $IOL_{MAX}$ defined above;

setting up the calculated $Vo_{(MIN)}$ at the voltage generating means and applying the voltage to the terminal of the IC under test;

measuring a current passing through the terminal of the IC under test by the current measuring means while the $Vo_{(MIN)}$ is set up;

and examining if the measuring current is equal to or greater than $IOL_{MIN}$ defined above.

* * * * *